(12) United States Patent
Gao et al.

(10) Patent No.: US 11,971,166 B2
(45) Date of Patent: Apr. 30, 2024

(54) QUANTUM DOT DISPLAY PANEL, PREPARATION METHOD THEREOF AND DISPLAY DEVICE

(71) Applicant: SHENZHEN PLANCK INNOVATION TECHNOLOGY CO., LTD, Guangdong (CN)

(72) Inventors: Danpeng Gao, Guangdong (CN); Zhikuan Zhang, Guangdong (CN); Limin Yang, Guangdong (CN); Xiaowei Sun, Guangdong (CN)

(73) Assignee: SHENZHEN PLANCK INNOVATION TECHNOLOGY CO., LTD, Guangdong (CN)

( * ) Notice: Subject to any disclaimer, the term of this patent is extended or adjusted under 35 U.S.C. 154(b) by 0 days.

(21) Appl. No.: 17/619,955

(22) PCT Filed: Mar. 23, 2021

(86) PCT No.: PCT/CN2021/082448
§ 371 (c)(1),
(2) Date: Dec. 16, 2021

(87) PCT Pub. No.: WO2022/134333
PCT Pub. Date: Jun. 30, 2022

(65) Prior Publication Data
US 2023/0332759 A1    Oct. 19, 2023

(30) Foreign Application Priority Data
Dec. 25, 2020    (CN) .......................... 202011566759.8

(51) Int. Cl.
*F21V 9/08*    (2018.01)
*F21K 9/00*    (2016.01)
(Continued)

(52) U.S. Cl.
CPC .................. *F21V 9/08* (2013.01); *F21K 9/00* (2013.01); *F21K 9/64* (2016.08); *G02B 5/204* (2013.01);
(Continued)

(58) Field of Classification Search
CPC ..... F21V 9/08; F21K 9/00; F21K 9/64; G02B 5/204; H01L 31/035218; H01L 33/502; F21Y 2115/10
See application file for complete search history.

(56) References Cited

U.S. PATENT DOCUMENTS 10,732,460 B1    8/2020    Chen et al.
2013/0242228 A1*    9/2013    Park .................. G02F 1/133617
257/E33.012

(Continued)

FOREIGN PATENT DOCUMENTS

| CN | 106405918 A | 2/2017 |
|----|-------------|--------|
| CN | 108681145 A | 10/2018 |

(Continued)

OTHER PUBLICATIONS

Notice of Reasons for Refusal dated Apr. 10, 2023 received in JP 2022-516758.

(Continued)

*Primary Examiner* — Elmito Breval
(74) *Attorney, Agent, or Firm* — Hunton Andrews Kurth LLP

(57) ABSTRACT

Provided are a quantum dot display panel, a preparation method, and a display device. The quantum dot display panel includes a backlight module, a quantum dot color filter structure, a first reflecting layer and a second reflecting layer. The quantum dot color filter structure is positioned on a light exit side of the backlight module. The quantum dot color filter structure includes at least a red quantum dot color filter (Continued)

unit, a green quantum dot color filter unit and a composite quantum dot color filter unit. The first reflecting layer is arranged on a side of the quantum dot color filter structure facing away from the backlight module. The first reflecting layer covers the red quantum dot color filter unit and the green quantum dot color filter unit. The second reflecting layer is arranged on a side of the backlight module facing away from the quantum dot color filter structure.

15 Claims, 10 Drawing Sheets

(51) Int. Cl.
    *F21K 9/64*     (2016.01)
    *G02B 5/20*     (2006.01)
    *H01L 31/0352*     (2006.01)
    *H01L 33/50*     (2010.01)
    *F21Y 115/10*     (2016.01)

(52) U.S. Cl.
    CPC .... *H01L 31/035218* (2013.01); *H01L 33/502* (2013.01); *F21Y 2115/10* (2016.08)

(56) References Cited

U.S. PATENT DOCUMENTS

| | | |
|---|---|---|
| 2014/0204319 A1 | 7/2014 | Cai et al. |
| 2015/0285985 A1 | 10/2015 | Shin et al. |
| 2015/0301408 A1* | 10/2015 | Li .................... G02F 1/133621 359/359 |
| 2017/0153366 A1 | 6/2017 | Park et al. |
| 2017/0336675 A1 | 11/2017 | Kim et al. |
| 2018/0003870 A1 | 1/2018 | Wu et al. |
| 2019/0081219 A1* | 3/2019 | Chen .................... H01L 33/504 |
| 2019/0227431 A1 | 7/2019 | Park et al. |

FOREIGN PATENT DOCUMENTS

| | | |
|---|---|---|
| CN | 105204103 B | 11/2018 |
| CN | 208970563 U | 6/2019 |
| CN | 111373544 A | 7/2020 |
| CN | 111458936 A | 7/2020 |
| CN | 111509025 A | 8/2020 |
| DE | 102017113741 A1 | 12/2018 |
| EP | 2757409 A1 | 7/2014 |
| JP | 2018098088 A | 6/2018 |
| JP | 2020067663 A | 4/2020 |
| WO | 2015025950 A1 | 2/2015 |
| WO | 2020088142 A1 | 7/2020 |

OTHER PUBLICATIONS

International Search Report dated Sep. 29, 2021 in International Application No. PCT/CN2021/082448.
Extended European Search Report dated Aug. 30, 2023 issued in EP21865311.1.
Decision of Refusal dated Sep. 21, 2023 issued in JP2022-516758.

\* cited by examiner

QUANTUM DOT DISPLAY PANEL, PREPARATION METHOD THEREOF AND DISPLAY DEVICE

CROSS-REFERENCE TO RELATED APPLICATIONS

This is a National Stage Application filed under 35 U.S.C. 371 based on International Patent Application No. PCT/CN2021/082448, filed on Mar. 23, 2021, which claims priority to Chinese Patent Application No. 202011566759.8 filed on Dec. 25, 2020, the disclosures of both of which are incorporated herein by reference in their entireties.

TECHNICAL FIELD

The present application relates to the field of display technologies, for example, a quantum dot display panel, a preparation method of the quantum dot display panel, and a display device.

BACKGROUND

A particle size of a quantum dot (QD) material is generally between 1 nm to 10 nm. Since electrons and electron holes are confined by quantum, a continuous electronic band structure becomes a discrete energy level structure, so that a luminescence spectroscopy is very narrow (from 20 nm to 30 nm), colorimetric purity is high, and display gamut is wide. As a new generation of luminescent materials, quantum dots are emerging in display applications due to special characteristics of the quantum dots. The quantum dot material absorbs a partial wavelength band of blue light to excite a partial wavelength band of green light and red light, thereby effectively improving gamut of a display screen and meeting needs of high-quality display applications.

A quantum dot color filter is a key component for a display device to achieve ultra-high gamut full color display. In the related art, quantum dot color filter technologies usually mix a red quantum dot material and a green quantum dot material together to form a quantum dot color conversion film. After passing through a display module and the quantum dot color conversion film, a blue backlight in a display panel also needs to pass through a color filter to filter red light, green light and the remaining blue light converted by the quantum dot color conversion film, so that each pixel dot can filter out the red light and the green light, resulting in low efficiency of emitting light from the pixel dot and reducing luminous efficiency of the display panel. In addition, in the above-mentioned scheme, red quantum dots, green quantum dots, and the red quantum dots and the green quantum dots are mixed directly to prepare a red quantum dot color filter unit, a green quantum dot color filter unit and a composite quantum dot color filter unit, respectively. Thus, the red quantum dots and the green quantum dots are directly mixed to prepare the composite quantum dot color filter unit, which causes the red quantum dots to re-absorb light emitted from the green quantum dots, thereby reducing luminous efficiency of white light emitted from the display panel and overall luminous efficiency of the display panel.

SUMMARY

The present application provides a quantum dot display panel, a preparation method of the quantum dot display panel, and a display device so as to improve luminous efficiency and display brightness of the quantum dot display panel.

The quantum dot display panel provided includes a backlight module, a quantum dot color filter structure, a first reflecting layer and a second reflecting layer.

The quantum dot color filter structure is positioned on a light exit side of the backlight module, and the quantum dot color filter structure includes at least a red quantum dot color filter unit, a green quantum dot color filter unit, and a composite quantum dot color filter unit.

The red quantum dot color filter unit and the green quantum dot color filter unit are arranged in a laminated mode. The red quantum dot color filter unit is closer to the backlight module than the green quantum dot color filter unit. Any two of the red quantum dot color filter unit, the green quantum dot color filter unit, and the composite quantum dot color filter unit do not overlap each other. The composite quantum dot color filter unit includes at least a red quantum dot color filter subunit and a green quantum dot color filter subunit which are arranged in a laminated mode. The red quantum dot color filter subunit is closer to the backlight module than the green quantum dot color filter subunit.

The first reflecting layer is disposed on a side of the quantum dot color filter structure facing away from the backlight module, and the first reflecting layer covers the red quantum dot color filter unit and the green quantum dot color filter unit.

The second reflecting layer is disposed on a side of the backlight module facing away from the quantum dot color filter structure, and the second reflecting layer covers the quantum dot color filter structure.

The preparation method of the quantum dot display panel provided includes: providing a backlight module; preparing a quantum dot color filter structure; where the quantum dot color filter structure is positioned on a light exit side of the backlight module; the quantum dot color filter structure includes at least a red quantum dot color filter unit, a green quantum dot color filter unit, and a composite quantum dot color filter unit; the red quantum dot color filter unit and the green quantum dot color filter unit are arranged in a laminated mode, the red quantum dot color filter unit is closer to the backlight module than the green quantum dot color filter unit, and any two of the red quantum dot color filter unit, the green quantum dot color filter unit, and the composite quantum dot color filter unit do not overlap each other; the composite quantum dot color filter unit includes at least a red quantum dot color filter subunit and a green quantum dot color filter subunit which are arranged in a laminated mode; and the red quantum dot color filter subunit is closer to the backlight module than the green quantum dot color filter subunit; forming a first reflecting layer on a side of the quantum dot color filter structure facing away from the backlight module, where the first reflecting layer covers the red quantum dot color filter unit and the green quantum dot color filter unit; and forming a second reflecting layer on a side of the backlight module facing away from the quantum dot color filter structure, where the second reflecting layer covers the quantum dot color filter structure.

The display device further provided includes the above-mentioned quantum dot display panel.

DETAILED DESCRIPTION

The present application is described hereinafter in conjunction with drawings and embodiments.

Figure 1:
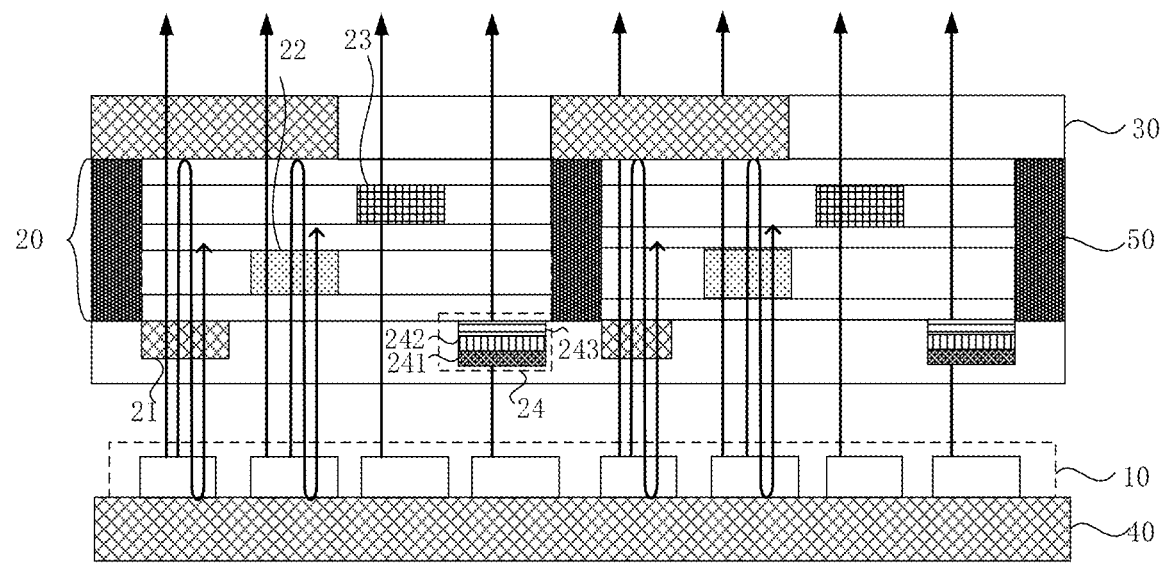
FIG. 1 is a diagram illustrating the structure of a quantum dot display panel according to an embodiment of the present application.
Figure 2:
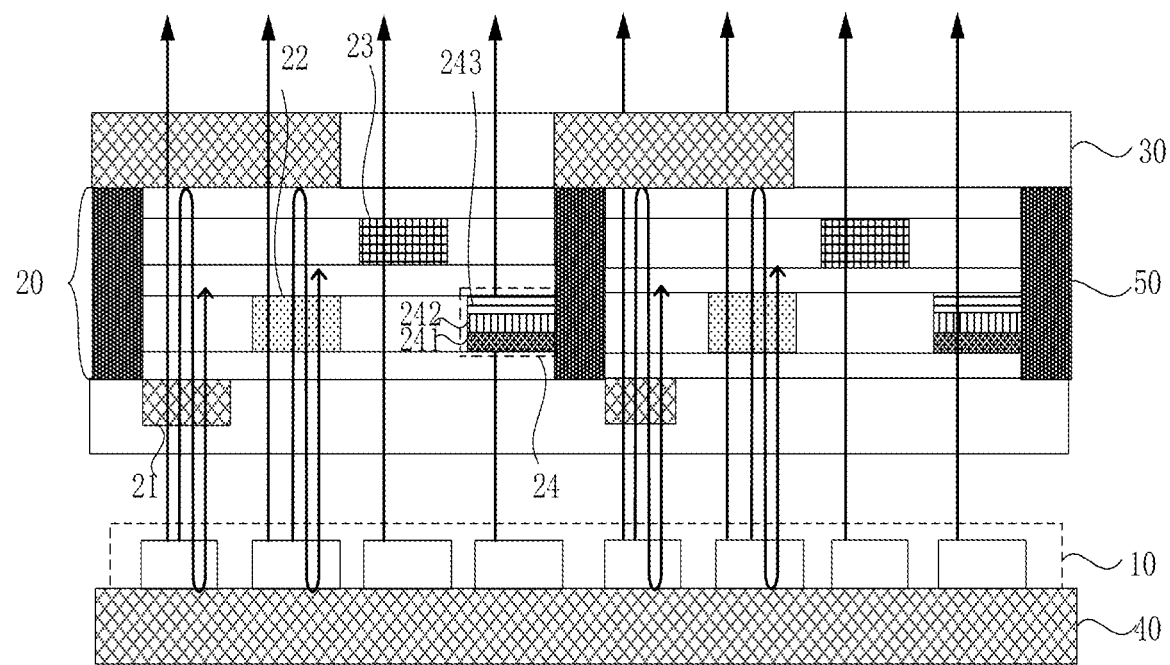
FIG. 2 is a diagram illustrating the structure of another quantum dot display panel according to an embodiment of the present application.

FIG. 1 is a diagram illustrating the structure of a quantum dot display panel according to an embodiment of the present application. FIG. 2 is a diagram illustrating the structure of another quantum dot display panel according to an embodiment of the present application. As shown in FIG. 1 and FIG. 2, the quantum dot display panel includes a backlight module 10, a quantum dot color filter structure 20, a first reflecting layer 30 and a second reflecting layer 40. The quantum dot color filter structure 20 is positioned on a light exit side of the backlight module 10, and the quantum dot color filter structure 20 includes at least a red quantum dot color filter unit 21, a green quantum dot color filter unit 22, and a composite quantum dot color filter unit 24. The red quantum dot color filter unit 21 and the green quantum dot color filter unit 22 are arranged in a laminated mode. The red quantum dot color filter unit 21 is close to a side of the backlight module 10. Any two of the red quantum dot color filter unit 21, the green quantum dot color filter unit 22, and the composite quantum dot color filter unit 24 do not overlap each other. The composite quantum dot color filter unit 24 includes at least a red quantum dot color filter subunit 241 and a green quantum dot color filter subunit 242 which are arranged in a laminated mode. The red quantum dot color filter subunit 241 is close to a side of the backlight module 10. The first reflecting layer 30 is disposed on a side of the quantum dot color filter structure 20 facing away from the backlight module 10, and the first reflecting layer 30 covers the red quantum dot color filter unit 21 and the green quantum dot color filter unit 22. The second reflecting layer 40 is disposed on a side of the backlight module 10 facing away from the quantum dot color filter structure 20, and the second reflecting layer 40 covers the quantum dot color filter structure 20.

The backlight module 10 includes a plurality of backlights arranged in an array, for example, any one of a light-emitting diode (LED) backlight, an Micro-LED light source, an Mini-LED matrix light source, or an organic light-emitting diode (OLED) light source. The backlight module 10 may be an ultraviolet backlight module or a blue backlight module. The ultraviolet backlight module emits ultraviolet light having a peak wavelength of emission light of 230 to 395 nm. The blue backlight module may emit blue light having a peak wavelength of emission light of 420 to 480 nm.

In an embodiment, FIG. 1 and FIG. 2 illustrate a case in which the backlight module 10 is the ultraviolet backlight module. The quantum dot color filter structure 20 includes the red quantum dot color filter unit 21, the green quantum dot color filter unit 22, a blue quantum dot color filter unit 23, and the composite quantum dot color filter unit 24. The red quantum dot color filter unit 21, the green quantum dot color filter unit 22, and the blue quantum dot color filter unit 23 are arranged in a laminated mode. The red quantum dot color filter unit 21 is close to a side of the backlight module 10, and any two of the red quantum dot color filter unit 21, the green quantum dot color filter unit 22, the blue quantum dot color filter unit 23, and the composite quantum dot color filter unit 24 do not overlap each other. In response to the backlight module 10 being the ultraviolet backlight module, the ultraviolet backlight module emits ultraviolet light, and excites the red quantum dot color filter unit 21, the green quantum dot color filter unit 22, the blue quantum dot color filter unit 23 and the composite quantum dot color filter unit 24 which do not overlap each other to emit red light, green light, blue light and white light, respectively, thereby achieving full color display of a display panel. Each quantum dot color filter unit emits light independently, which also improves luminous efficiency of the display panel. Moreover, display brightness of the display panel is also improved by adding the composite quantum dot color filter unit 24.

In addition, the red quantum dot color filter unit 21, the green quantum dot color filter unit 22, and the blue quantum dot color filter unit 23 which are arranged in a laminated mode close to a side of the ultraviolet backlight module can reduce re-absorption of light emitted from short-wavelength quantum dot color filter units (the green quantum dot color filter unit and the blue quantum dot color filter unit) by a long-wavelength quantum dot color filter unit (the red quantum dot color filter unit 21), which improves overall luminous efficiency of the display panel.

Figure 3:
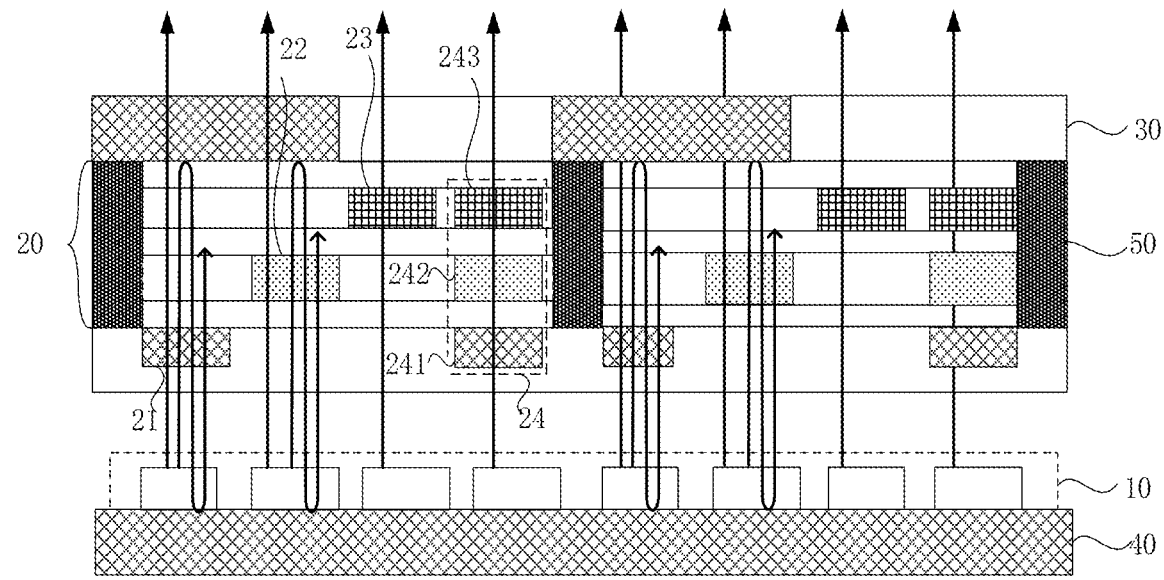
FIG. 3 is a diagram illustrating the structure of another quantum dot display panel according to an embodiment of the present application.

FIG. 3 is a diagram illustrating the structure of another quantum dot display panel according to an embodiment of the present application, and FIG. 3 illustrates a case in which the backlight module 10 is the ultraviolet backlight module. Referring to FIGS. 1 to 3, the composite quantum dot color filter unit 24 includes a red quantum dot color filter subunit 241, a green quantum dot color filter subunit 242, and a blue quantum dot color filter subunit 243 which are arranged in a laminated mode. The red quantum dot color filter subunit 241 is close to a side of the backlight module 10. Referring to FIG. 1, the composite quantum dot color filter unit 24 is disposed in a same layer as the red quantum dot color filter unit 21. Or, referring to FIG. 2, the composite quantum dot color filter unit 24 is disposed in a same layer as the green quantum dot color filter unit 22. In this manner, the composite quantum dot color filter unit 24 is disposed in a same layer as the green quantum dot color filter unit 22 or in a same layer as the red quantum dot color filter unit 21, so that re-absorption of light emitted from a short-wavelength quantum dot color filter unit (the blue quantum dot color filter unit 23) by long-wavelength (red and green) quantum dot color filter subunits in the composite quantum dot color filter unit 24 can be avoided. Or, referring to FIG. 3, in the composite quantum dot color filter unit 24, the red quantum dot color filter subunit 241 is disposed in a same layer as the red quantum dot color filter unit 21, the green quantum dot color filter subunit 242 is disposed in a same layer as the green quantum dot color filter unit 22, and the blue quantum dot color filter subunit 243 is disposed in a same layer as the blue quantum dot color filter unit 23. Thus, the composite quantum dot color filter unit 24 which is arranged in such laminated mode prevents a long-wavelength (red) quantum dot color filter subunit from re-absorbing light emitted from short-wavelength (green and blue) quantum dot color filter subunits, thereby improving luminous efficiency of white light emitted from the composite quantum dot color filter unit 24 excited by the ultraviolet backlight module, and improving the luminous efficiency of the display panel.

In the related art, a red quantum dot material, a green quantum dot material, and a blue quantum dot material are mixed together to form a quantum dot color filter unit. After the ultraviolet backlight module in the display panel passes through the quantum dot color filter unit, the ultraviolet backlight module further passes through a color filter to filter the red, green, and blue light converted by the quantum dot color filter unit, resulting in problems such as reduction in the luminous efficiency of the display panel. In the present technical solution, a plurality of quantum dot color filter units is arranged in a laminated mode. The ultraviolet light emitted from the ultraviolet backlight module separately excites the plurality of quantum dot color filter units to emit red, green, blue and white light, without further filtering through a color filter, so that the luminous efficiency of the display panel is improved on a basis of achieving full color display. Moreover, the composite quantum dot color filter unit 24 which is arranged in a laminated mode improves the luminous efficiency of the display panel. Meanwhile, excess ultraviolet light passing through the red quantum dot color filter unit 21, the green quantum dot color filter unit 22, and the blue quantum dot color filter unit 23 is reflected by the first reflecting layer 30 on two sides of the quantum dot color filter structure 20, so that the ultraviolet light is not emitted at the red quantum dot color filter unit 21, the green quantum dot color filter unit 22, the blue quantum dot color filter unit 23, and the composite quantum dot color filter unit 24, thereby avoiding a low display color purity in each quantum dot color filter unit. The excessive ultraviolet light reflected by the second reflecting layer 40 can continue to excite the plurality of quantum dot color filter units, thereby avoiding waste of the ultraviolet light and improving the luminous efficiency of the display panel.

Figure 4:
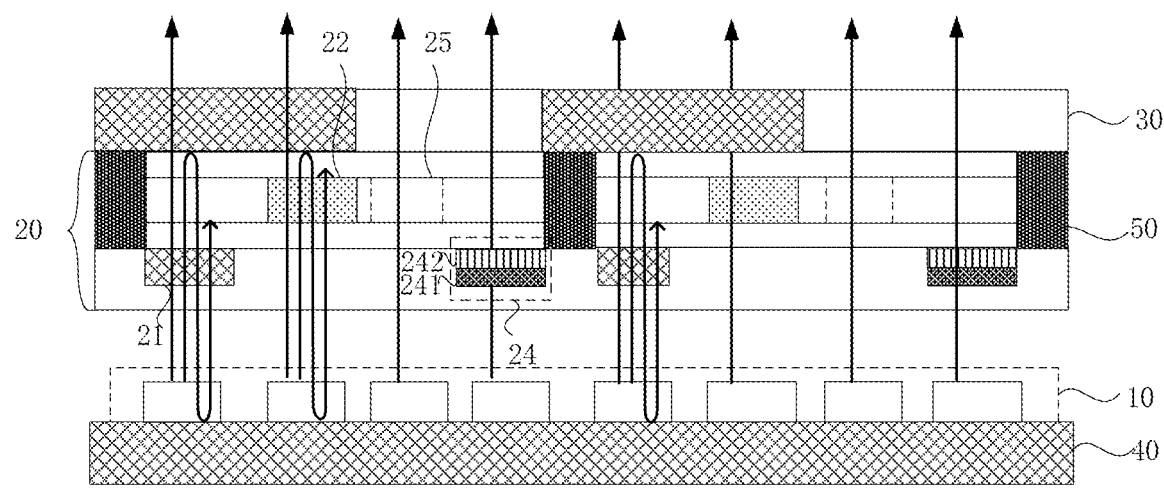
FIG. 4 is a diagram illustrating the structure of another quantum dot display panel according to an embodiment of the present application.
Figure 5:
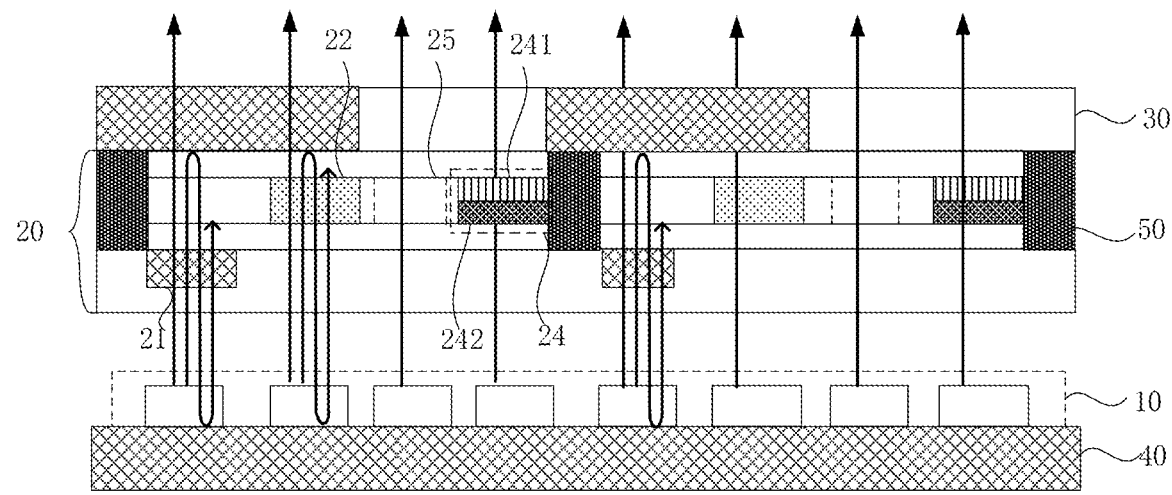
FIG. 5 is a diagram illustrating the structure of another quantum dot display panel according to an embodiment of the present application.

In an embodiment, FIG. 4 is a diagram illustrating the structure of another quantum dot display panel according to an embodiment of the present application, and FIG. 5 is a diagram illustrating the structure of another quantum dot display panel according to an embodiment of the present application. As shown in FIG. 4 and FIG. 5, the backlight module 10 in FIG. 4 and FIG. 5 is a blue backlight module. The quantum dot color filter structure 20 includes the red quantum dot color filter unit 21, the green quantum dot color filter unit 22, and the composite quantum dot color filter unit 24, and further includes a blue light transmissive region 25. The red quantum dot color filter unit 21 and the green quantum dot color filter unit 22 are arranged in a laminated mode. The red quantum dot color filter unit 21 is close to a side of the backlight module 10. Any two of the red quantum dot color filter unit 21, the green quantum dot color filter unit 22, and the composite quantum dot color filter unit 24 do not overlap each other. In response to the backlight module 10 being the blue backlight module, the blue backlight module emits blue light to excite the red quantum dot color filter unit 21, the green quantum dot color filter unit 22, and the composite quantum dot color filter unit 24 which do not overlap each other to emit red, green and white light, respectively, and the blue light transmissive region 25 emits blue light, thereby achieving full color display. Each quantum dot color filter unit emits light separately without passing through the color filter to filter light, thereby improving the luminous efficiency of the display panel. The display brightness of the display panel is also improved by adding the composite quantum dot color filter unit 24.

In addition, the red quantum dot color filter unit 21 and the green quantum dot color filter unit 22 which are arranged in a laminated mode close to the blue backlight module can reduce the re-absorption of light emitted from the green quantum dot color filter unit 22 by the red quantum dot color filter unit 21, thereby improving overall luminous efficiency of the display panel.

Figure 6:
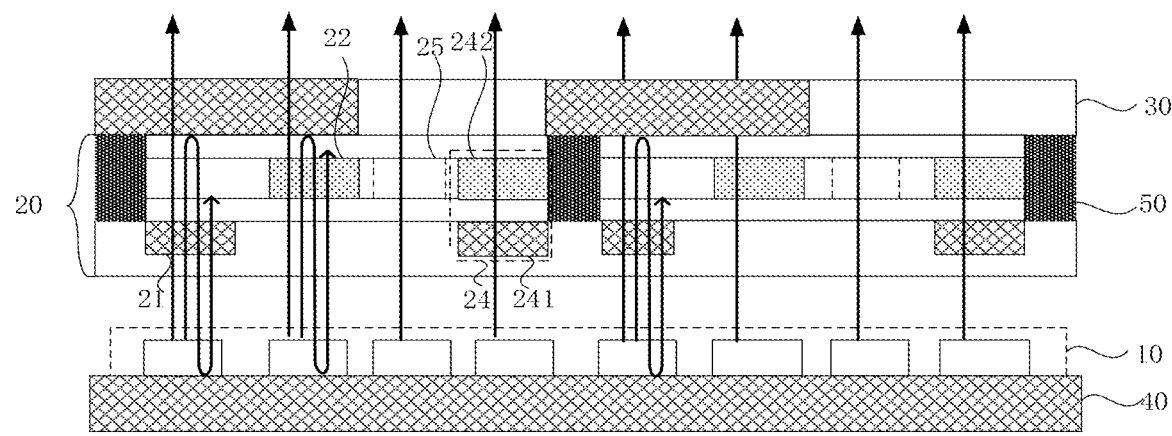
FIG. 6 is a diagram illustrating the structure of another quantum dot display panel according to an embodiment of the present application.

FIG. 6 is a diagram illustrating the structure of another quantum dot display panel according to an embodiment of the present application, and FIG. 6 illustrates a case in which the backlight module 10 is the blue backlight module. As shown in FIG. 6, the composite quantum dot color filter unit 24 includes the red quantum dot color filter subunit 241 and the green quantum dot color filter subunit 242 which are arranged in a laminated mode. The red quantum dot color filter subunit 241 is close to a side of the backlight module 10. Referring to FIG. 4, the composite quantum dot color filter unit 24 is disposed in a same layer as the red quantum dot color filter unit 21. Or, referring to FIG. 5, the composite quantum dot color filter unit 24 is disposed in a same layer as the green quantum dot color filter unit 22. Or, referring to FIG. 6, in the composite quantum dot color filter unit 24, the red quantum dot color filter subunit 241 is disposed in a same layer as the red quantum dot color filter unit 21, and the green quantum dot color filter subunit 242 is disposed in a same layer as the green quantum dot color filter unit 22. The composite quantum dot color filter unit 24 which is arranged in such laminated mode prevents the long-wavelength (red) quantum dot color filter subunit from re-absorbing light emitted from a short-wavelength (green) quantum dot color filter subunit, thereby improving luminous efficiency of white light emitted from the composite quantum dot color filter unit 24 excited by the blue backlight module, and improving the luminous efficiency of the display panel. Meanwhile, excess blue light passing through the red quantum dot color filter unit 21, the green quantum dot color filter unit 22, and the composite quantum dot color filter unit 24 is reflected by the first reflecting layer 30 on the two sides of the quantum dot color filter structure 20, so that the blue light is not emitted at the red quantum dot color filter unit 21, the green quantum dot color filter unit 22, and the composite quantum dot color filter unit 24, thereby avoiding the low display color purity in each quantum dot color filter unit. The excessive blue light reflected by the second reflecting layer 40 can continue to excite the plurality of quantum dot color filter units, thereby avoiding waste of the blue light and improving the luminous efficiency of the display panel.

Figure 7:
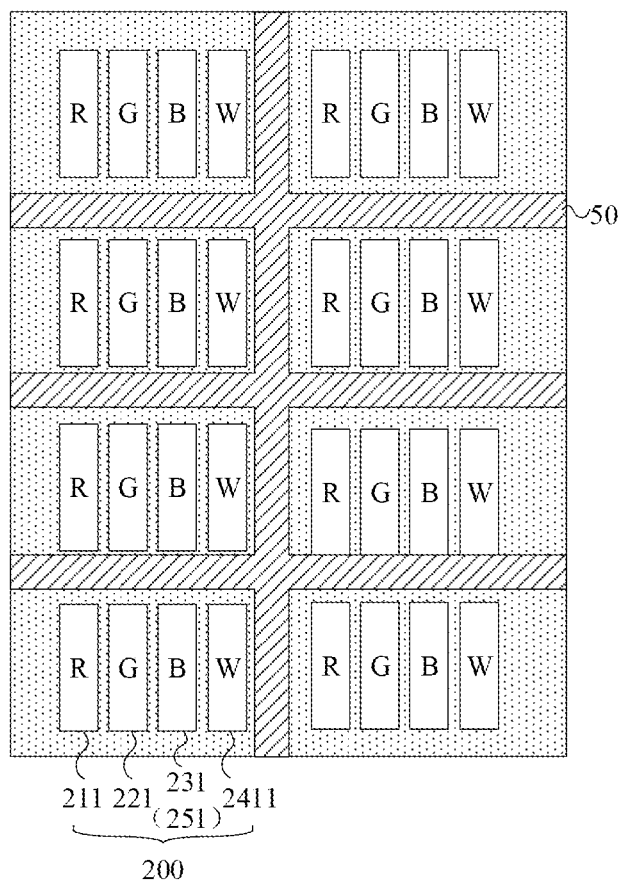
FIG. 7 is a top view illustrating the structure of a quantum dot display panel according to an embodiment of the present application.

In an embodiment, the description is made on the basis of the above-mentioned embodiments. FIG. 7 is a top view illustrating the structure of a quantum dot display panel according to an embodiment of the present application. Referring to FIGS. 1 to 7, the red quantum dot color filter unit 21 includes a plurality of red sub-pixels 211, the green quantum dot color filter unit 22 includes a plurality of green sub-pixels 221, and the blue quantum dot color filter unit 23 includes a plurality of blue sub-pixels 231 or the blue light transmissive region 25 includes a plurality of blue sub-pixels 251. Moreover, the composite quantum dot color filter unit 24 includes a plurality of white sub-pixels 2411. Among the plurality of red sub-pixels 211, the plurality of green sub-pixels 221, the plurality of blue sub-pixels 231, and the plurality of white sub-pixels 2411, one red sub-pixel 211, one green sub-pixel 221, one blue sub-pixel 231, and one white sub-pixel 2411 which are adjacent to each other form one pixel unit 200. The quantum dot display panel further includes a light-shielding bank 50, and the light-shielding bank 50 is disposed between adjacent pixel units 200, so that a plurality of pixel units 200 can be separated, which avoids optical crosstalk and improves image resolution of the display panel.

Figure 8:
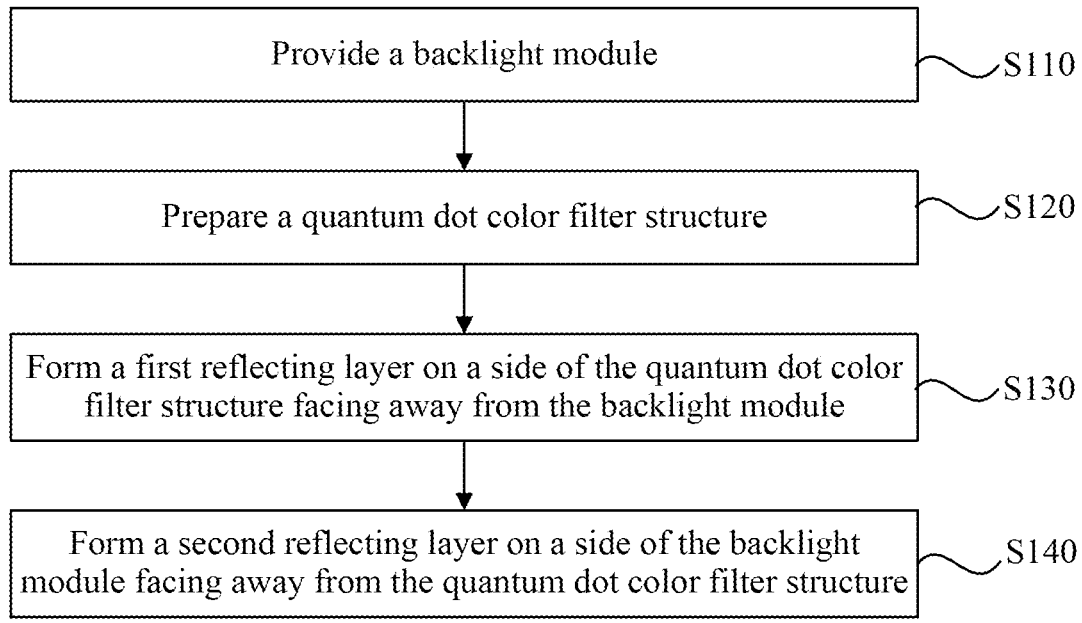
FIG. 8 is a flowchart of a preparation method of a quantum dot display panel according to an embodiment of the present application.

The embodiment of the present application further provides a preparation method of a quantum dot display panel. FIG. 8 is a flowchart of a preparation method of a quantum dot display panel according to an embodiment of the present application. As shown in FIG. 8, the preparation method includes the steps below.

In S110, a backlight module is provided.

Referring to the diagrams illustrating the structure of the quantum dot display panels shown in FIGS. 1 to 6, the backlight module 10 includes a plurality of backlights arranged in an array. The backlight module 10 may be the ultraviolet backlight module or the blue backlight module. In FIGS. 1 to 3, the backlight module 10 is the ultraviolet backlight module. In FIGS. 4 to 6, the backlight module 10 is the blue backlight module.

In S120, a quantum dot color filter structure is prepared.

Referring to FIGS. 1 to 6, the quantum dot color filter structure 20 is positioned on a light exit side of the backlight module. As shown in FIGS. 1 to 3, in response to the backlight module 10 being the ultraviolet backlight module, the quantum dot color filter structure 20 includes at least the red quantum dot color filter unit 21, the green quantum dot color filter unit 22, the blue quantum dot color filter unit 23, and the composite quantum dot color filter unit 24. In the present technical solution, the red quantum dot color filter unit 21, the green quantum dot color filter unit 22 and the blue quantum dot color filter unit 23, which are arranged in a laminated mode, are prepared through photolithography. The red quantum dot color filter unit 21 is positioned close to a side of the backlight module 10. Any two of the red quantum dot color filter unit 21, the green quantum dot color filter unit 22, the blue quantum dot color filter unit 23, and the composite quantum dot color filter unit 24 do not overlap each other. Referring to FIGS. 1 to 3, the red quantum dot color filter subunit 241, the green quantum dot color filter subunit 242, and the blue quantum dot color filter subunit 243 in the composite quantum dot color filter unit 24 are prepared in a laminated mode. In an embodiment, referring to FIG. 1, the red quantum dot color filter subunit 241, the green quantum dot color filter subunit 242 and the blue quantum dot color filter subunit 243 which are arranged in a laminated mode, are completed in a same photolithography process with the red quantum dot color filter unit 21. Or, referring to FIG. 2, the red quantum dot color filter subunit 241, the green quantum dot color filter subunit 242 and the blue quantum dot color filter subunit 243 which are arranged in a laminated mode, are completed in a same photolithography process with the green quantum dot color filter unit 22. Or, referring to FIG. 3, the red quantum dot color filter unit 21 and the red quantum dot color filter subunit 241 are completed in a same photolithography process, the green quantum dot color filter unit 22 and the green quantum dot color filter subunit 242 are completed in a same photolithography process, and the blue quantum dot color filter unit 23 and the blue quantum dot color filter subunit 243 are completed in a same photolithography process to form the composite quantum dot color filter unit 24. In this manner, the composite quantum dot color filter unit 24 which is arranged in a laminated mode prevents the long-wavelength (red) quantum dot color filter subunit from re-absorbing light emitted from the short-wavelength (green and blue) quantum dot color filter subunits, thereby improving luminous efficiency of white light emitted from the composite quantum dot color filter unit 24 excited by the ultraviolet backlight module, and improving the luminous efficiency of the display panel.

Referring to FIGS. 4 to 6, in response to the backlight module 10 being the blue backlight module, the quantum dot color filter structure 20 includes the red quantum dot color filter unit 21, the green quantum dot color filter unit 22, and the composite quantum dot color filter unit 24. In the present technical solution, the red quantum dot color filter unit 21 and the green quantum dot color filter unit 22 which are arranged in a laminated mode are prepared through photolithography. The red quantum dot color filter unit 21 is positioned close to a side of the backlight module 10. Any two of the red quantum dot color filter unit 21, the green quantum dot color filter unit 22, and the composite quantum dot color filter unit 24 do not overlap each other. Referring to FIGS. 4 to 6, the red quantum dot color filter subunit 241 and the green quantum dot color filter subunit 242 in the composite quantum dot color filter unit 24 are prepared in a laminated mode. In an embodiment, referring to FIG. 4, the red quantum dot color filter subunit 241 and the green quantum dot color filter subunit 242 which are arranged in a laminated mode, are completed in a same photolithography process with the red quantum dot color filter unit 21. Or, referring to FIG. 5, the red quantum dot color filter subunit 241 and the green quantum dot color filter subunit 242 which are arranged in a laminated mode, are completed in a same photolithography process with the green quantum dot color filter unit 22. Or, referring to FIG. 6, the red quantum dot color filter unit 21 and the red quantum dot color filter subunit 241 are completed in a same photolithography process, and the green quantum dot color filter unit 22 and the green quantum dot color filter subunit 242 are completed in a same photolithography process to form the composite quantum dot color filter unit 24. In this manner, the composite quantum dot color filter unit 24 which is arranged in a laminated mode prevents the long-wavelength (red) quantum dot color filter subunit from re-absorbing light emitted from the short-wavelength (green) quantum dot color filter subunit, thereby improving luminous efficiency of white light emitted from the composite quantum dot color filter unit 24 excited by the blue backlight module, and improving the luminous efficiency of the display panel.

In S130, a first reflecting layer on a side of the quantum dot color filter structure facing away from the backlight module is formed.

In S140, a second reflecting layer on a side of the backlight module facing away from the quantum dot color filter structure is formed.

In the present technical solution, the backlight module 10 emits short-wavelength light rays which separately excite a plurality of quantum dot color filter units that do not overlap each other to emit red light, green light, blue light, and white light, respectively, achieving full color display of the display panel. Or, the backlight module 10 emits short-wavelength light rays which excite a plurality of quantum dot color filter units that do not overlap each other to emit red light, green light, and white light, respectively, to cooperate with the blue light transmissive region 25 achieving full color display of the display panel. Each quantum dot color filter unit emits light independently without filtering light through the color filter, which improves the luminous efficiency of the display panel. Display brightness of the display panel is also improved by adding the composite quantum dot color filter unit 24. In addition, the red quantum dot color filter unit 21 and the green quantum dot color filter unit 22 are arranged in a laminated mode close to a side of the backlight module 10. Or, the red quantum dot color filter unit 21, the green quantum dot color filter unit 22, and the blue quantum dot color filter unit 23 which are arranged in a laminated mode close to a side of the backlight module 10 can reduce the long-wavelength quantum dot color filter unit (the red quantum dot color filter unit 21) re-absorbing light emitted from the short-wavelength quantum dot color filter units (the green quantum dot color filter unit 22 and the blue quantum dot color filter unit 23), which improves overall luminous efficiency of the display panel. Further, the composite quantum dot color filter unit 24 which is arranged in a laminated mode improves the luminous efficiency of the display panel for emitting white light. Meanwhile, excessive short-wavelength light passing through the plurality of quantum dot color filter units is reflected by a reflecting layer on two sides of the quantum dot color filter structure 20 to continue to excite the plurality of quantum dot color filter units, thereby avoiding waste of short-wavelength light and improving the luminous efficiency of the display panel. In the related art, a red quantum dot material and a green quantum dot material are mixed together to form the quantum dot color filter unit, or a red quantum dot material, a green quantum dot material and a blue quantum dot material are mixed together to form the quantum dot color filter unit. After passing through the quantum dot color filter unit, the backlight module in the display panel needs to filter the red, green and blue light after being converted by the quantum dot color filter unit through the color filter. As a result, the luminous efficiency of the display panel is reduced and the red quantum dot material and the green quantum dot material or the red quantum dot material, the green quantum dot material and the blue quantum dot material are directly mixed. In processes of preparation and application of quantum dot color filter structure, each quantum dot can affect each other, resulting in performance deterioration, poor reliability and other problems.

Figure 21:
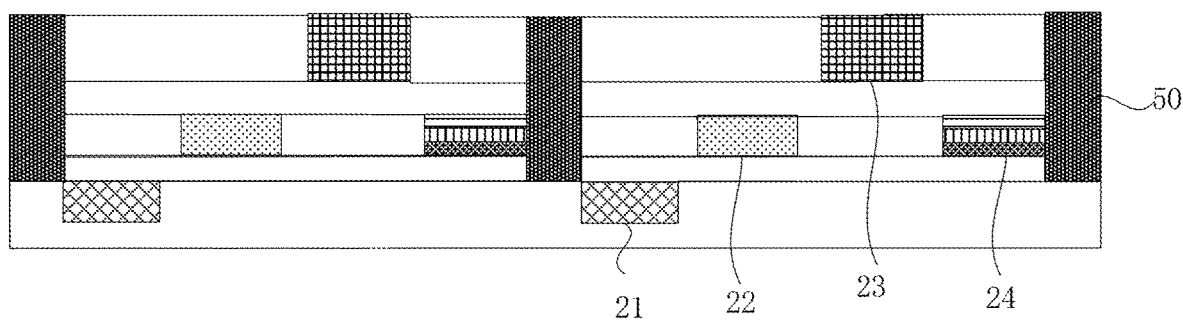
FIG. 21 is a diagram illustrating a photolithography preparation process of another quantum dot display panel according to an embodiment of the present application.
Figure 22:
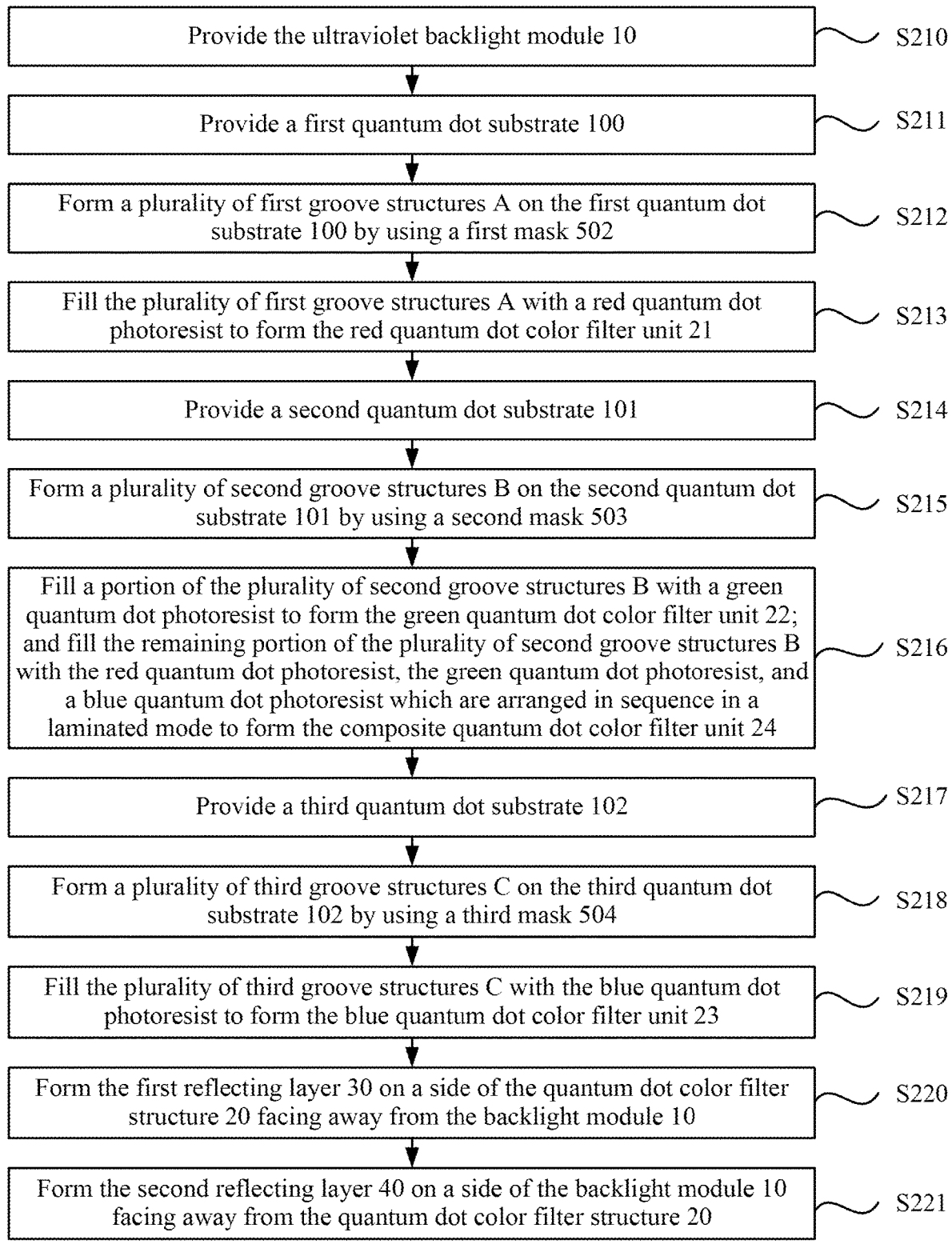
FIG. 22 is a flowchart of photolithography preparation of a quantum dot display panel according to an embodiment of the present application.

FIGS. 9 to 21 are diagrams illustrating photolithography preparation processes of quantum dot display panels according to embodiments of the present application. FIG. 22 is a flowchart of photolithography preparation of a quantum dot display panel according to an embodiment of the present application. Referring to FIGS. 9 to 21, the backlight module 10 is the ultraviolet backlight module. The quantum dot color filter structure 20 is prepared by photolithography. Preparation steps of the display panel are as follows.

In S210, the ultraviolet backlight module 10 is provided.

In S211, a first quantum dot substrate 100 is provided.

In S212, a plurality of first groove structures A are formed on the first quantum dot substrate 100 by using a first mask 502.

In S213, the plurality of first groove structures A are filled with a red quantum dot photoresist to form the red quantum dot color filter unit 21.

Figure 9:
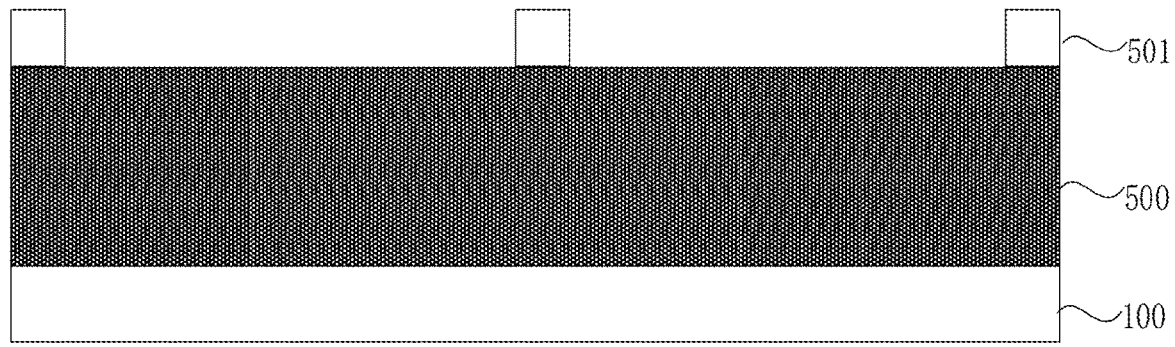
FIG. 9 is a diagram illustrating a photolithography preparation process of a quantum dot display panel according to an embodiment of the present application.
Figure 10:
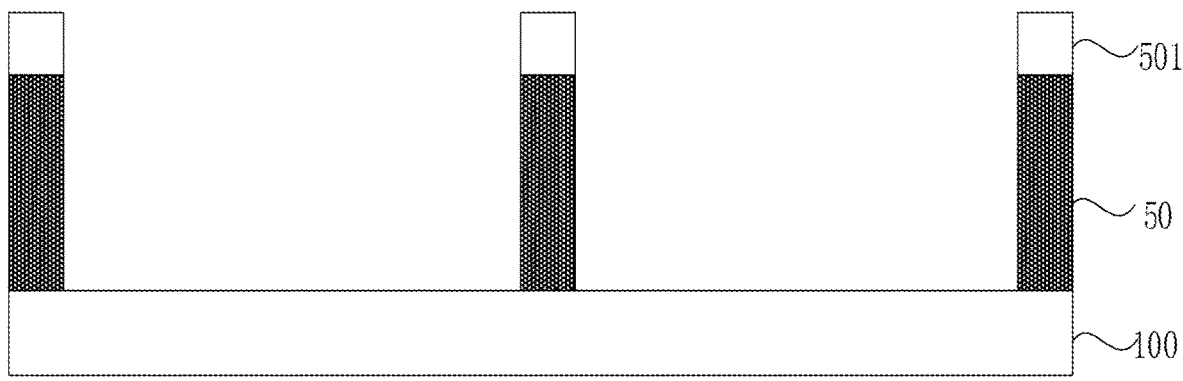
FIG. 10 is a diagram illustrating a photolithography preparation process of another quantum dot display panel according to an embodiment of the present application.

Referring to FIG. 9 and FIG. 10, the light-shielding bank 50 is prepared through a photolithography process before the quantum dot color filter structure 20 is prepared. First, a light-shielding bank structure layer 500 is prepared on a side of the first quantum dot substrate 100, and then a plurality of light-shielding banks 50 are formed by etching the light-shielding bank structure layer 500 through a bank mask 501. The light-shielding bank structure layer 500 may use some organic materials and opaque materials dispersed in the organic materials. The plurality of quantum dot color filter units formed subsequently may be separated to prevent optical crosstalk.

Figure 11:
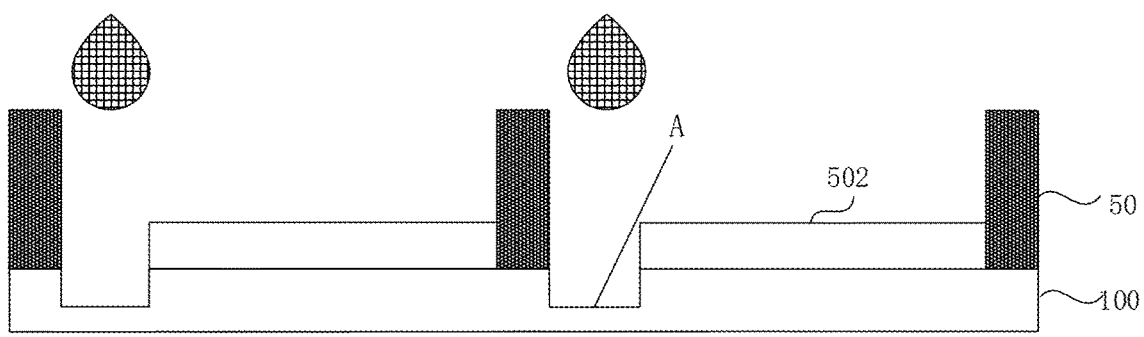
FIG. 11 is a diagram illustrating a photolithography preparation process of another quantum dot display panel according to an embodiment of the present application.
Figure 12:
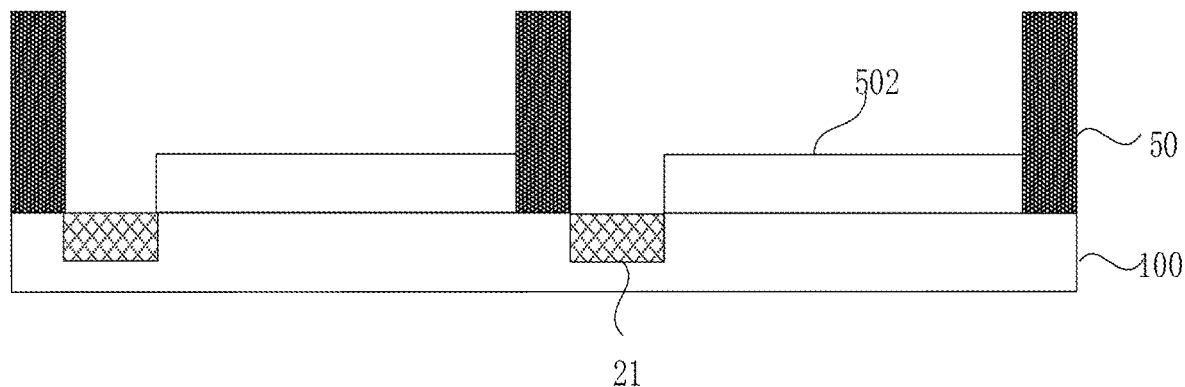
FIG. 12 is a diagram illustrating a photolithography preparation process of another quantum dot display panel according to an embodiment of the present application.
Figure 13:
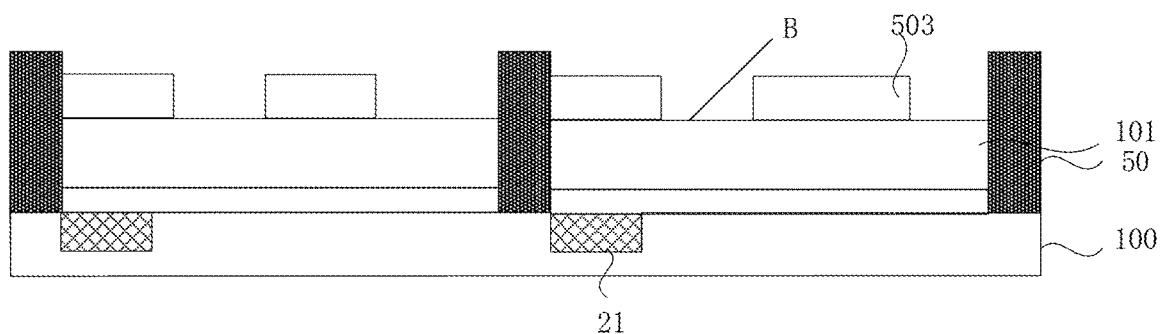
FIG. 13 is a diagram illustrating a photolithography preparation process of another quantum dot display panel according to an embodiment of the present application.
Figure 14:
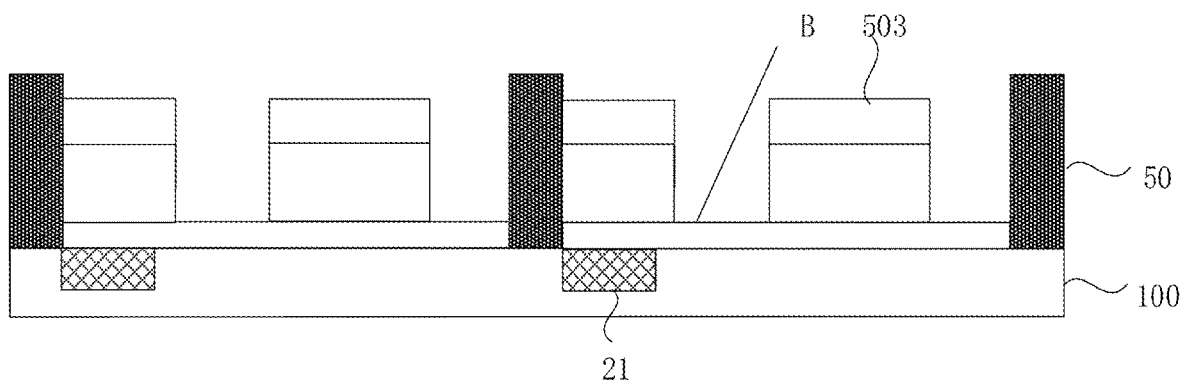
FIG. 14 is a diagram illustrating a photolithography preparation process of another quantum dot display panel according to an embodiment of the present application.
Figure 15:
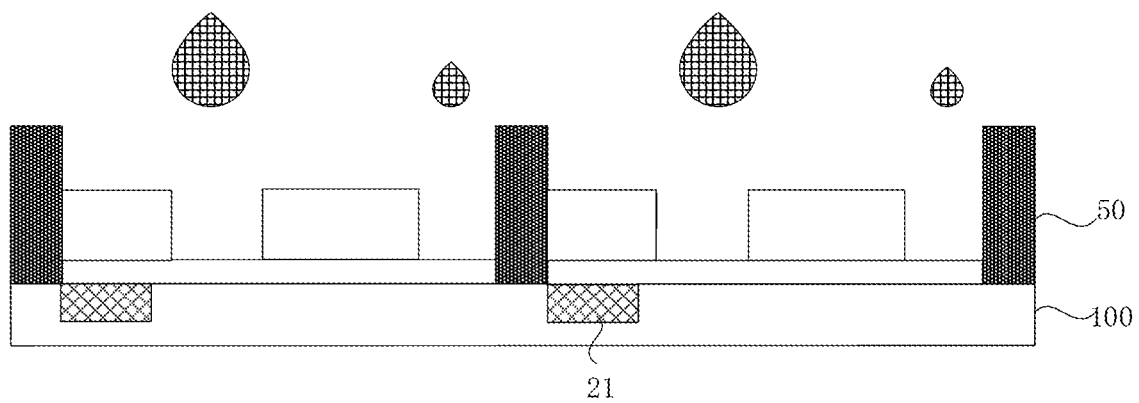
FIG. 15 is a diagram illustrating a photolithography preparation process of another quantum dot display panel according to an embodiment of the present application.
Figure 16:
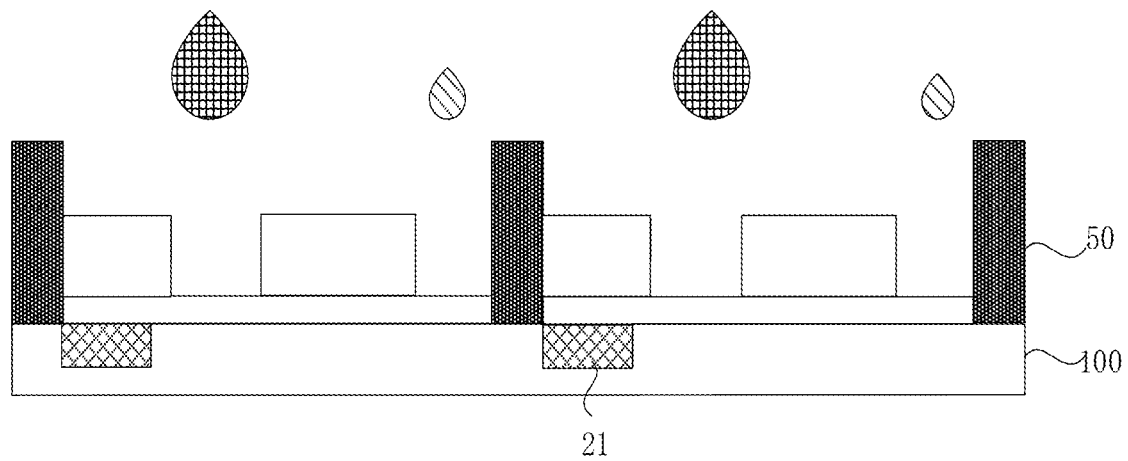
FIG. 16 is a diagram illustrating a photolithography preparation process of another quantum dot display panel according to an embodiment of the present application.
Figure 17:
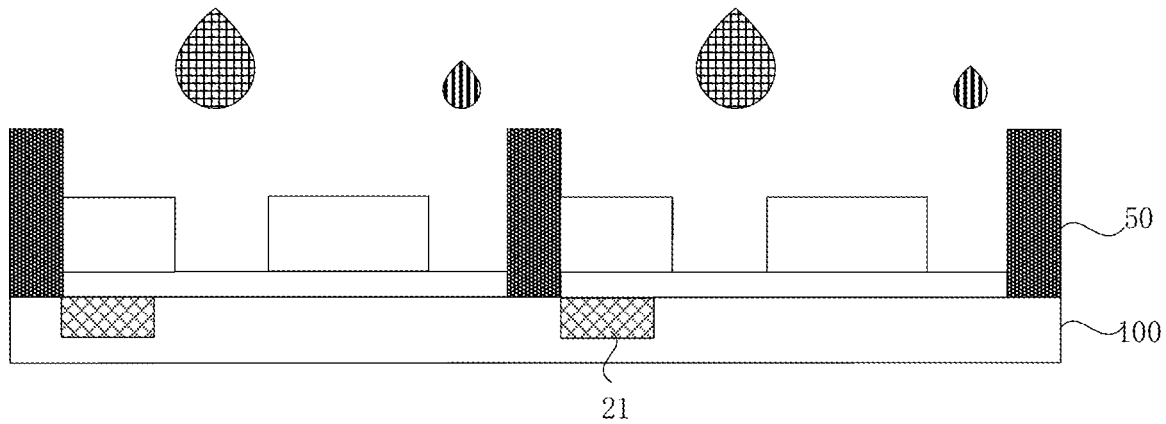
FIG. 17 is a diagram illustrating a photolithography preparation process of another quantum dot display panel according to an embodiment of the present application.
Figure 18:
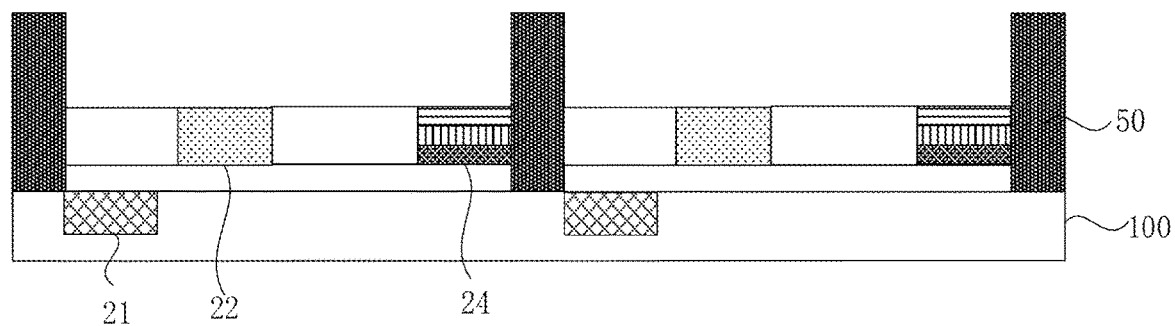
FIG. 18 is a diagram illustrating a photolithography preparation process of another quantum dot display panel according to an embodiment of the present application.

Referring to FIG. 11 and FIG. 12, the red quantum dot color filter unit 21 is formed by photolithography and development using the first mask 502. Preparation steps of quantum dot photoresist are as follows. First, a mixed material consisting of a quantum dot material core (preferably a composite material of one or at least two of cadmium selenide (CdSe), indium phosphide (InP), and cesium plumbum bromine3 (CsPbBr3)), a quantum dot shell coating material, and a quantum dot surface ligand material is prepared. Then, the mixed material is centrifuged and purified to obtain a quantum dot solution. Then, the quantum dot solution after mixing is added to a glue monomer and stirred. Finally, a mixture of the quantum dot solution and the glue monomer obtained is added to a photoinitiator and stirred to obtain the quantum dot photoresist.

In an embodiment, purposes of using a mixture of red quantum dots and photoresists to form the red quantum dot photoresist are to fill the red quantum dot photoresist in the first groove structure, and then cure the red quantum dot photoresist, and then precisely control the thickness of the red quantum dot photoresist filling layer by using the photolithography process. For example, the red quantum dot photoresist may be accurately controlled to photolithograph to a specified depth, or the red quantum dot photoresist overflowing around the plurality of first groove structure A may be removed by photolithography.

In S214, a second quantum dot substrate 101 is provided.

In S215, a plurality of second groove structures B are formed on the second quantum dot substrate 101 by using a second mask 503.

In S216, a portion of the plurality of second groove structures B are filled with a green quantum dot photoresist to form the green quantum dot color filter unit 22; and a remaining portion of the plurality of second groove structures B are filled with a red quantum dot photoresist, a green quantum dot photoresist, and a blue quantum dot photoresist which are arranged in sequence in a laminated mode to form the composite quantum dot color filter unit 24.

Referring to FIGS. 13 to 18, the green quantum dot color filter unit 22 and the composite quantum dot color filter unit 24 are similarly formed by photolithography and development using the second mask 503. The green quantum dot color filter unit 22 and the composite quantum dot color filter unit 24 are formed in a same photolithography process, so that the long-wavelength quantum dot (red quantum dot and green quantum dot) color filter subunit re-absorbing light emitted from the short-wavelength quantum dot color filter unit (the blue quantum dot color filter unit 23) in the composite quantum dot color filter unit 24 is prevented, which improves the overall luminous efficiency of the display panel. Effects of using the green quantum dot photoresist are the same as those of using the red quantum dot photoresist. The composite quantum dot color filter unit 24 is prepared through laminating the red quantum dot photoresist, the green quantum dot photoresist, and the blue quantum dot photoresist, which prevents the long-wavelength (red) quantum dot color filter subunit from re-absorbing light emitted from the short-wavelength (green and blue) quantum dot color filter subunits in the composite quantum dot color filter unit 24. In this manner, the luminous efficiency of white light emitted from the composite quantum dot color filter unit 24 excited by the backlight module 10 is improved, and the luminous efficiency of the display panel is improved. In a preparation process, the thickness of each quantum dot photoresist filling layer in the composite quantum dot color filter unit 24 can be accurately controlled by using the quantum dot photoresist.

In S217, a third quantum dot substrate 102 is provided.

In S218, a plurality of third groove structures C are formed on the third quantum dot substrate 102 by using a third mask 504.

In S219, the plurality of third groove structures C are filled with a blue quantum dot photoresist to form the blue quantum dot color filter unit 23.

Figure 19:
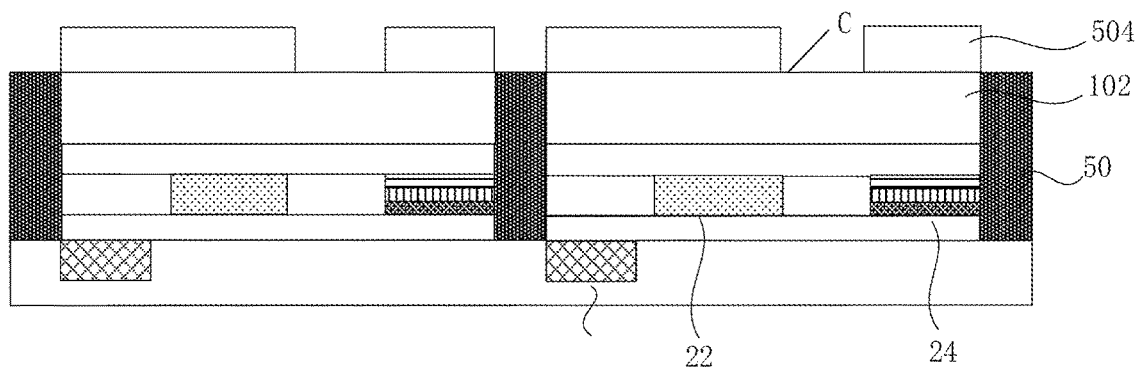
FIG. 19 is a diagram illustrating a photolithography preparation process of another quantum dot display panel according to an embodiment of the present application.
Figure 20:
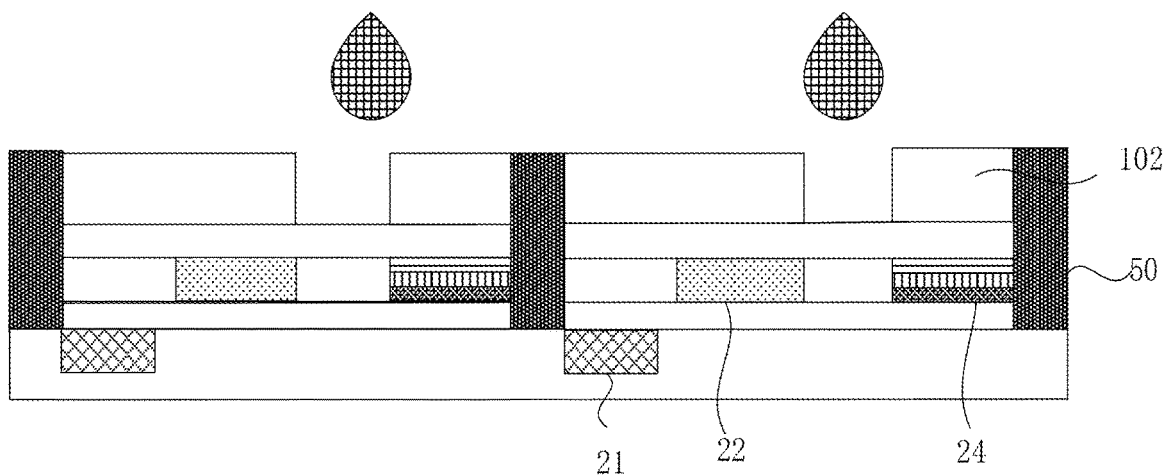
FIG. 20 is a diagram illustrating a photolithography preparation process of another quantum dot display panel according to an embodiment of the present application.

Effects of the blue quantum dot photoresist are the same as those of the red quantum dot photoresist, and repetition is not made here. Referring to FIGS. 19 to 21, the blue quantum dot color filter unit 23 is formed by photolithography and development using the third mask 504. Thus, the ultraviolet backlight module emits the ultraviolet light to excite the discrete red quantum dot color filter unit 21, green quantum dot color filter unit 22, blue quantum dot color filter unit 23, and composite quantum dot color filter unit 24 which do not overlap each other to emit red light, green light, blue light, and white light, respectively, thereby achieving full color display of the quantum dot display panel. Each quantum dot color filter unit emits light independently without filtering light through a filter, which improves the luminous efficiency of the display panel. Brightness of the display panel is also improved by adding the composite quantum dot color filter unit 24. Meanwhile, the composite quantum dot color filter unit 24 which is arranged in a laminated mode improves the luminous efficiency of the display panel for emitting white light. In addition, the red quantum dot color filter unit 21, the green quantum dot color filter unit 22, and the blue quantum dot color filter unit 23 which are arranged in a laminated mode close to the ultraviolet backlight module can reduce the long-wavelength quantum dot color filter unit (the red quantum dot color filter unit 21) re-absorbing light emitted from the short-wavelength quantum dot color filter units (the green quantum dot color filter unit 22 and the blue quantum dot color filter unit 23), thereby improving the luminous efficiency of the display panel.

In S220, the first reflecting layer 30 on a side of the quantum dot color filter structure 20 facing away from the backlight module 10 is formed.

In S221, the second reflecting layer 40 on a side of the backlight module 10 facing away from the quantum dot color filter structure 20 is formed.

Or, referring to the same photolithography process in FIGS. 9 to 21, the backlight module 10 is the ultraviolet backlight module, and the quantum dot color filter structure 20 is prepared by photolithography. The composite quantum dot color filter unit 24 and the green quantum dot color filter unit 22 are completed in a same photolithography process. A preparation process of the quantum dot color filter structure 20 is as follows.

A first quantum dot substrate is provided. A plurality of first groove structures are formed on the first quantum dot substrate by using a first mask. A portion of the plurality of first groove structures are filled with a red quantum dot photoresist to form the red quantum dot color filter unit 21, and a remaining portion of the plurality of first groove structures are filled with a red quantum dot photoresist, a green quantum dot photoresist, and a blue quantum dot photoresist which are arranged in sequence in a laminated mode to form the composite quantum dot color filter unit 24. A second quantum dot substrate is provided. The second quantum dot substrate is positioned on a side of the red quantum dot color filter unit 21 facing away from the backlight module 10. A plurality of second groove structures are formed on the second quantum dot substrate by using a second mask. The plurality of second groove structures are filled with a green quantum dot photoresist to form the green quantum dot color filter unit 22. A third quantum dot substrate is provided. The third quantum dot substrate is positioned on a side of the green quantum dot color filter unit 22 facing away from the red quantum dot color filter unit 21. A plurality of third groove structures are formed on the third quantum dot substrate by using a third mask. The plurality of third groove structures are filled with a blue quantum dot photoresist to form the blue quantum dot color filter unit 23.

Or, referring to the same photolithography process in FIGS. 9 to 21, the backlight module 10 is the ultraviolet backlight module, and the quantum dot color filter structure 20 is prepared by photolithography. In the composite quantum dot color filter unit 24, the red quantum dot color filter subunit 241 and the red quantum dot color filter unit 21 are completed in a same photolithography process, the green quantum dot color filter subunit 242 and the green quantum dot color filter unit 22 are completed in a same photolithography process, and the blue quantum dot color filter subunit 243 and the blue quantum dot color filter unit 23 are completed in a same photolithography process to form the composite quantum dot color filter unit 24. A preparation process of the quantum dot color filter structure 20 is as follows.

A first quantum dot substrate is provided. A plurality of first groove structures are formed on the first quantum dot substrate by using a first mask. A portion of the plurality of first groove structures are filled with a red quantum dot photoresist to form the red quantum dot color filter unit 21, and a remaining portion of the plurality of first groove structures are filled with a red quantum dot photoresist to form the red quantum dot color filter subunit 241 in the composite quantum dot color filter unit 24. A second quantum dot substrate is provided. The second quantum dot substrate is positioned on a side of the red quantum dot color filter unit 21 facing away from the backlight module 10. A plurality of second groove structures are formed on the second quantum dot substrate by using a second mask. A portion of the plurality of second groove structures are filled with a green quantum dot photoresist to form the green quantum dot color filter unit 22, and a remaining portion of the plurality of second groove structures are filled with a green quantum dot photoresist to form the green quantum dot color filter subunit 242 in the composite quantum dot color filter unit 24. A third quantum dot substrate is provided. The third quantum dot substrate is positioned on a side of the green quantum dot color filter unit 22 facing away from the red quantum dot color filter unit 21. A plurality of third groove structures are formed on the third quantum dot substrate by using a third mask. A portion of the plurality of third groove structures are filled with a blue quantum dot photoresist to form the blue quantum dot color filter unit 23, and a remaining portion of the plurality of third groove structures are filled with a blue quantum dot photoresist to form the blue quantum dot color filter subunit 243 in the composite quantum dot color filter unit 24. Projections of the red quantum dot color filter subunit 241, the green quantum dot color filter subunit 242 and the blue quantum dot color filter subunit 243 overlap on the first quantum dot substrate.

In an embodiment, the backlight module 10 is the blue backlight module, and the quantum dot color filter structure 20 is prepared based on a same photolithography process. The composite quantum dot color filter unit 24 and the red quantum dot color filter unit 21 are prepared in a same photolithography process. The quantum dot color filter structure 20 includes: providing a first quantum dot substrate; forming a plurality of first groove structures on the first quantum dot substrate by using a first mask; filling the plurality of first groove structures with a red quantum dot photoresist to form the red quantum dot color filter unit 21; providing a second quantum dot substrate, where the second quantum dot substrate is positioned on a side of the red quantum dot color filter unit 21 facing away from the backlight module 10; forming a plurality of second groove structures on the second quantum dot substrate by using a second mask; filling a portion of the plurality of second groove structures with a green quantum dot photoresist to form the green quantum dot color filter unit 22; and filling a remaining portion of the plurality of second groove structures with a red quantum dot photoresist, a green quantum dot photoresist, and a blue quantum dot photoresist which are arranged in sequence in a laminated mode to form the composite quantum dot color filter unit 24.

Or, the backlight module 10 is the blue backlight module, and the quantum dot color filter structure 20 is prepared based on a same photolithography process. The composite quantum dot color filter unit 24 and the green quantum dot color filter unit 22 are prepared in a same photolithography process. The quantum dot color filter structure 20 includes: providing a first quantum dot substrate; forming a plurality of first groove structures on the first quantum dot substrate by using a first mask; filling a portion of the plurality of first groove structures with a red quantum dot photoresist to form the red quantum dot color filter unit 21; filling a remaining portion of the plurality of first groove structures with a red quantum dot photoresist, a green quantum dot photoresist, and a blue quantum dot photoresist which are arranged in sequence in a laminated mode to form the composite quantum dot color filter unit 24; providing a second quantum dot substrate, where the second quantum dot substrate is positioned on a side of the red quantum dot color filter unit 21 facing away from the backlight module 10; forming a plurality of second groove structures on the second quantum dot substrate by using a second mask; and filling the plurality of second groove structures with a green quantum dot photoresist to form the green quantum dot color filter unit 22.

Or, the backlight module 10 is the blue backlight module, and the quantum dot color filter structure 20 is prepared based on a same photolithography process. In the composite quantum dot color filter unit 24, the red quantum dot color filter subunit 241 and the red quantum dot color filter unit 21 are completed in a same photolithography process, and the green quantum dot color filter subunit 242 and the green quantum dot color filter unit 22 are completed in a same photolithography process to form the composite quantum dot color filter unit 24. The quantum dot color filter structure 20 includes: providing a first quantum dot substrate; forming a plurality of first groove structures on the first quantum dot substrate by using a first mask; filling a portion of the plurality of first groove structures with a red quantum dot photoresist to form the red quantum dot color filter unit 21; filling a remaining portion of the plurality of first groove structures with a red quantum dot photoresist to form the red quantum dot color filter subunit 241 in the composite quantum dot color filter unit 24; providing a second quantum dot substrate, where the second quantum dot substrate is positioned on a side of the red quantum dot color filter unit 21 facing away from the backlight module 10; forming a plurality of second groove structures on the second quantum dot substrate by using a second mask; filling a portion of the second groove structures with a green quantum dot photoresist to form the green quantum dot color filter unit 22; and filling a remaining portion of the plurality of second groove structures with a green quantum dot photoresist to form the green quantum dot color filter subunit 242 in the composite quantum dot color filter unit 24; where projections of the red quantum dot color filter subunit 241 and the green quantum dot color filter subunit 242 overlap on the first quantum dot substrate.

In response to the backlight module 10 being the blue backlight module, similarly, the composite quantum dot color filter unit 24 which is arranged in a laminated mode, thus preventing the long-wavelength (red) quantum dot color filter subunit from re-absorbing light emitted from the short-wavelength (green) quantum dot color filter subunit, thereby improving the luminous efficiency of white light emitted from the composite quantum dot color filter unit 24 excited by the blue backlight module, and improving the luminous efficiency of the display panel.

An embodiment of the present application provides a quantum dot display device. The display device includes the quantum dot display panel provided by any one of the above-mentioned embodiments. Therefore, the quantum dot display device provided by the embodiment of the present application has technical effects of the technical solution in any one of the above-mentioned embodiments, and repetition is not made here.

What is claimed is:

1. A quantum dot display panel, comprising:
a backlight module;
a quantum dot color filter structure positioned on a light exit side of the backlight module, wherein the quantum dot color filter structure comprises at least a red quantum dot color filter unit, a green quantum dot color filter unit, and a composite quantum dot color filter unit,
wherein the red quantum dot color filter unit and the green quantum dot color filter unit are arranged in a laminated mode, the red quantum dot color filter unit is closer to the backlight module than the green quantum dot color filter unit, and any two of the red quantum dot color filter unit, the green quantum dot color filter unit, and the composite quantum dot color filter unit do not overlap each other; the composite quantum dot color filter unit comprises at least a red quantum dot color filter subunit and a green quantum dot color filter subunit which are arranged in a laminated mode; and the red quantum dot color filter subunit is closer to the backlight module than the green quantum dot color filter subunit;
a first reflecting layer disposed on a side of the quantum dot color filter structure facing away from the backlight module, wherein the first reflecting layer covers the red quantum dot color filter unit and the green quantum dot color filter unit; and
a second reflecting layer disposed on a side of the backlight module facing away from the quantum dot color filter structure, wherein the second reflecting layer covers the quantum dot color filter structure.

2. The quantum dot display panel of claim 1, wherein the composite quantum dot color filter unit is disposed in a same layer as the red quantum dot color filter unit or the green quantum dot color filter unit; or, in the composite quantum dot color filter unit, at least the red quantum dot color filter subunit is disposed in a same layer as the red quantum dot color filter unit, and at least the green quantum dot color filter subunit is disposed in a same layer as the green quantum dot color filter unit.

3. The quantum dot display panel of claim 2, wherein the backlight module comprises an ultraviolet backlight module;
the quantum dot color filter structure further comprises a blue quantum dot color filter unit; and the red quantum dot color filter unit, the green quantum dot color filter unit, and the blue quantum dot color filter unit are arranged in a laminated mode, the red quantum dot color filter unit is closer to the backlight module than the green quantum dot color filter unit and the blue quantum dot color filter unit, and any two of the red quantum dot color filter unit, the green quantum dot color filter unit, the blue quantum dot color filter unit, and the composite quantum dot color filter unit do not overlap each other;
the composite quantum dot color filter unit further comprises a blue quantum dot color filter subunit which is arranged in a laminated mode with the red quantum dot color filter subunit and the green quantum dot color filter subunit; and the red quantum dot color filter subunit is closer to the backlight module than the green quantum dot color filter subunit and the blue quantum dot color filter subunit; and
the composite quantum dot color filter unit is disposed in the same layer as the red quantum dot color filter unit or the green quantum dot color filter unit; or, in the composite quantum dot color filter unit, the red quantum dot color filter subunit is disposed in the same layer as the red quantum dot color filter unit, the green quantum dot color filter subunit is disposed in the same layer as the green quantum dot color filter unit, and the blue quantum dot color filter subunit is disposed in a same layer as the blue quantum dot color filter unit.

4. The quantum dot display panel of claim 3, wherein the red quantum dot color filter unit comprises a plurality of red sub-pixels, the green quantum dot color filter unit comprises a plurality of green sub-pixels, the blue quantum dot color filter unit comprises a plurality of blue sub-pixels, and the composite quantum dot color filter unit comprises a plurality of white sub-pixels; and among the plurality of red sub-pixels, the plurality of green sub-pixels, the plurality of blue sub-pixels, and the plurality of white sub-pixels, one red sub-pixel, one green sub-pixel, one blue sub-pixel, and one white sub-pixel which are adjacent to each other form one pixel unit; and
the quantum dot display panel further comprises a light-shielding bank, and the light-shielding bank is disposed between adjacent pixel units.

5. The quantum dot display panel of claim 2, wherein the backlight module comprises a blue backlight module.

6. The quantum dot display panel of claim 5, wherein the quantum dot color filter structure further comprises a blue light transmissive region;
the red quantum dot color filter unit comprises a plurality of red sub-pixels, the green quantum dot color filter unit comprises a plurality of green sub-pixels, the blue light transmissive region comprises a plurality of blue sub-pixels, and the composite quantum dot color filter unit comprises a plurality of white sub-pixels; and among the plurality of red sub-pixels, the plurality of green sub-pixels, the plurality of blue sub-pixels, and the plurality of white sub-pixels, one red sub-pixel, one green sub-pixel, one blue sub-pixel, and one white sub-pixel which are adjacent to each other form one pixel unit; and
the quantum dot display panel further comprises a light-shielding bank, and the light-shielding bank is disposed between adjacent pixel units.

7. A preparation method of a quantum dot display panel, comprising:
providing a backlight module;
preparing a quantum dot color filter structure, wherein the quantum dot color filter structure is positioned on a light exit side of the backlight module; the quantum dot color filter structure comprises at least a red quantum dot color filter unit, a green quantum dot color filter unit, and a composite quantum dot color filter unit; the red quantum dot color filter unit and the green quantum dot color filter unit are arranged in a laminated mode, the red quantum dot color filter unit is closer to the backlight module than the green quantum dot color filter unit, and any two of the red quantum dot color filter unit, the green quantum dot color filter unit, or the composite quantum dot color filter unit do not overlap each other; the composite quantum dot color filter unit comprises at least a red quantum dot color filter subunit and a green quantum dot color filter subunit which are arranged in a laminated mode; and the red quantum dot color filter subunit is closer to the backlight module than the green quantum dot color filter subunit;
forming a first reflecting layer on a side of the quantum dot color filter structure facing away from the backlight module, wherein the first reflecting layer covers the red quantum dot color filter unit and the green quantum dot color filter unit; and forming a second reflecting layer on a side of the backlight module facing away from the quantum dot color filter structure, wherein the second reflecting layer covers the quantum dot color filter structure.

8. The method of claim 7, wherein the backlight module comprises an ultraviolet backlight module; and preparing the quantum dot color filter structure comprises:
providing a first quantum dot substrate;
forming a plurality of first groove structures on the first quantum dot substrate by using a first mask;
filling the plurality of first groove structures with a red quantum dot photoresist to form the red quantum dot color filter unit;
providing a second quantum dot substrate, wherein the second quantum dot substrate is positioned on a side of the red quantum dot color filter unit facing away from the backlight module;
forming a plurality of second groove structures on the second quantum dot substrate by using a second mask;
filling a portion of the plurality of second groove structures with a green quantum dot photoresist to form the green quantum dot color filter unit; and filling a remaining portion of the plurality of second groove structures with a red quantum dot photoresist, a green quantum dot photoresist, and a blue quantum dot photoresist which are arranged in sequence in a laminated mode to form the composite quantum dot color filter unit;
providing a third quantum dot substrate, wherein the third quantum dot substrate is positioned on a side of the green quantum dot color filter unit facing away from the red quantum dot color filter unit;
forming a plurality of third groove structures on the third quantum dot substrate by using a third mask; and
filling the plurality of third groove structures with a blue quantum dot photoresist to form a blue quantum dot color filter unit;
preparing the quantum dot color filter structure comprises:
providing a first quantum dot substrate;
forming a plurality of first groove structures on the first quantum dot substrate by using a first mask;
filling a portion of the plurality of first groove structures with a red quantum dot photoresist to form the red quantum dot color filter unit; and filling a remaining portion of the plurality of first groove structures with a red quantum dot photoresist, a green quantum dot photoresist, and a blue quantum dot photoresist which are arranged in sequence in a laminated mode to form the composite quantum dot color filter unit;
providing a second quantum dot substrate, wherein the second quantum dot substrate is positioned on a side of the red quantum dot color filter unit facing away from the backlight module;
forming a plurality of second groove structures on the second quantum dot substrate by using a second mask;
filling the plurality of second groove structures with a green quantum dot photoresist to form the green quantum dot color filter unit;
providing a third quantum dot substrate, wherein the third quantum dot substrate is positioned on a side of the green quantum dot color filter unit facing away from the red quantum dot color filter unit;
forming a plurality of third groove structures on the third quantum dot substrate by using a third mask; and filling the plurality of third groove structures with a blue quantum dot photoresist to form a blue quantum dot color filter unit;
or,
preparing the quantum dot color filter structure comprises:
providing a first quantum dot substrate;
forming a plurality of first groove structures on the first quantum dot substrate by using a first mask;
filling a portion of the plurality of first groove structures with a red quantum dot photoresist to form the red quantum dot color filter unit; and filling a remaining portion of the plurality of first groove structures with a red quantum dot photoresist to form the red quantum dot color filter subunit in the composite quantum dot color filter unit;
providing a second quantum dot substrate, wherein the second quantum dot substrate is positioned on a side of the red quantum dot color filter unit facing away from the backlight module;
forming a plurality of second groove structures on the second quantum dot substrate by using a second mask;
filling a portion of the plurality of second groove structures with a green quantum dot photoresist to form the green quantum dot color filter unit; and filling a remaining portion of the plurality of second groove structures with a green quantum dot photoresist to form the green quantum dot color filter subunit in the composite quantum dot color filter unit;
providing a third quantum dot substrate, wherein the third quantum dot substrate is positioned on a side of the green quantum dot color filter unit facing away from the red quantum dot color filter unit;
forming a plurality of third groove structures on the third quantum dot substrate by using a third mask; and
filling a portion of the plurality of third groove structures with a blue quantum dot photoresist to form a blue quantum dot color filter unit; and filling a remaining portion of the plurality of third groove structures with a blue quantum dot photoresist to form a blue quantum dot color filter subunit in the composite quantum dot color filter unit,
wherein projections of the red quantum dot color filter subunit, the green quantum dot color filter subunit, and the blue quantum dot color filter subunit on the first quantum dot substrate overlap.

9. The method of claim 7, wherein the backlight module comprises a blue backlight module; and preparing the quantum dot color filter structure comprises:
providing a first quantum dot substrate;
forming a plurality of first groove structures on the first quantum dot substrate by using a first mask;
filling the plurality of first groove structures with a red quantum dot photoresist to form the red quantum dot color filter unit;
providing a second quantum dot substrate, wherein the second quantum dot substrate is positioned on a side of the red quantum dot color filter unit facing away from the backlight module;
forming a plurality of second groove structures on the second quantum dot substrate by using a second mask; and
filling a portion of the plurality of second groove structures with a green quantum dot photoresist to form the green quantum dot color filter unit; and filling a remaining portion of the plurality of second groove structures with a red quantum dot photoresist, a green quantum dot photoresist, and a blue quantum dot photoresist which are arranged in sequence in a laminated mode to form the composite quantum dot color filter unit;

preparing the quantum dot color filter structure comprises:

providing a first quantum dot substrate;

forming a plurality of first groove structures on the first quantum dot substrate by using a first mask;

filling a portion of the plurality of first groove structures with a red quantum dot photoresist to form the red quantum dot color filter unit; and filling a remaining portion of the plurality of first groove structures with a red quantum dot photoresist, a green quantum dot photoresist, and a blue quantum dot photoresist which are arranged in sequence in a laminated mode to form the composite quantum dot color filter unit;

providing a second quantum dot substrate, wherein the second quantum dot substrate is positioned on a side of the red quantum dot color filter unit facing away from the backlight module;

forming a plurality of second groove structures on the second quantum dot substrate by using a second mask; and filling the plurality of second groove structures with a green quantum dot photoresist to form the green quantum dot color filter unit;

or, preparing the quantum dot color filter structure comprises:

providing a first quantum dot substrate;

forming a plurality of first groove structures on the first quantum dot substrate by using a first mask;

filling a portion of the plurality of first groove structures with a red quantum dot photoresist to form the red quantum dot color filter unit; and filling a remaining portion of the plurality of first groove structures with a red quantum dot photoresist to form the red quantum dot color filter subunit in the composite quantum dot color filter unit;

providing a second quantum dot substrate, wherein the second quantum dot substrate is positioned on a side of the red quantum dot color filter unit facing away from the backlight module;

forming a plurality of second groove structures on the second quantum dot substrate by using a second mask;

filling a portion of the plurality of second groove structures with a green quantum dot photoresist to form the green quantum dot color filter unit; and filling a remaining portion of the plurality of second groove structures with a green quantum dot photoresist to form the green quantum dot color filter subunit in the composite quantum dot color filter unit, wherein projections of the red quantum dot color filter subunit and the green quantum dot color filter subunit on the first quantum dot substrate overlap.

10. A display device, comprising a quantum dot display panel, wherein the quantum dot display panel comprise:

a backlight module;

a quantum dot color filter structure positioned on a light exit side of the backlight module, wherein the quantum dot color filter structure comprises at least a red quantum dot color filter unit, a green quantum dot color filter unit, and a composite quantum dot color filter unit, wherein the red quantum dot color filter unit and the green quantum dot color filter unit are arranged in a laminated mode, the red quantum dot color filter unit is closer to the backlight module than the green quantum dot color filter unit, and any two of the red quantum dot color filter unit, the green quantum dot color filter unit, and the composite quantum dot color filter unit do not overlap each other; the composite quantum dot color filter unit comprises at least a red quantum dot color filter subunit and a green quantum dot color filter subunit which are arranged in a laminated mode; and the red quantum dot color filter subunit is closer to the backlight module than the green quantum dot color filter subunit;

a first reflecting layer disposed on a side of the quantum dot color filter structure facing away from the backlight module, wherein the first reflecting layer covers the red quantum dot color filter unit and the green quantum dot color filter unit; and a second reflecting layer disposed on a side of the backlight module facing away from the quantum dot color filter structure, wherein the second reflecting layer covers the quantum dot color filter structure.

11. The display device of claim 10, wherein the composite quantum dot color filter unit is disposed in a same layer as the red quantum dot color filter unit or the green quantum dot color filter unit; or, in the composite quantum dot color filter unit, at least the red quantum dot color filter subunit is disposed in a same layer as the red quantum dot color filter unit, and at least the green quantum dot color filter subunit is disposed in a same layer as the green quantum dot color filter unit.

12. The display device of claim 11, wherein the backlight module comprises an ultraviolet backlight module;

the quantum dot color filter structure further comprises a blue quantum dot color filter unit; and the red quantum dot color filter unit, the green quantum dot color filter unit, and the blue quantum dot color filter unit are arranged in a laminated mode, the red quantum dot color filter unit is closer to the backlight module than the green quantum dot color filter unit and the blue quantum dot color filter unit, and any two of the red quantum dot color filter unit, the green quantum dot color filter unit, the blue quantum dot color filter unit, and the composite quantum dot color filter unit do not overlap each other;

the composite quantum dot color filter unit further comprises a blue quantum dot color filter subunit which is arranged in a laminated mode with the red quantum dot color filter subunit and the green quantum dot color filter subunit; and the red quantum dot color filter subunit is closer to the backlight module than the green quantum dot color filter subunit and the blue quantum dot color filter subunit; and the composite quantum dot color filter unit is disposed in the same layer as the red quantum dot color filter unit or the green quantum dot color filter unit; or, in the composite quantum dot color filter unit, the red quantum dot color filter subunit is disposed in the same layer as the red quantum dot color filter unit, the green quantum dot color filter subunit is disposed in the same layer as the green quantum dot color filter unit, and the blue quantum dot color filter subunit is disposed in a same layer as the blue quantum dot color filter unit.

13. The display device of claim 12, wherein the red quantum dot color filter unit comprises a plurality of red sub-pixels, the green quantum dot color filter unit comprises a plurality of green sub-pixels, the blue quantum dot color filter unit comprises a plurality of blue sub-pixels, and the composite quantum dot color filter unit comprises a plurality of white sub-pixels; and among the plurality of red sub-pixels, the plurality of green sub-pixels, the plurality of blue sub-pixels, and the plurality of white sub-pixels, one red sub-pixel, one green sub-pixel, one blue sub-pixel, and one white sub-pixel which are adjacent to each other form one pixel unit; and the quantum dot display panel further comprises a light-shielding bank, and the light-shielding bank is disposed between adjacent pixel units.

14. The display device of claim 11, wherein the backlight module comprises a blue backlight module.

15. The display device of claim 14, wherein the quantum dot color filter structure further comprises a blue light transmissive region;

the red quantum dot color filter unit comprises a plurality of red sub-pixels, the green quantum dot color filter unit comprises a plurality of green sub-pixels, the blue light transmissive region comprises a plurality of blue sub-pixels, and the composite quantum dot color filter unit comprises a plurality of white sub-pixels; and among the plurality of red sub-pixels, the plurality of green sub-pixels, the plurality of blue sub-pixels, and the plurality of white sub-pixels, one red sub-pixel, one green sub-pixel, one blue sub-pixel, and one white sub-pixel which are adjacent to each other form one pixel unit; and the quantum dot display panel further comprises a light-shielding bank, and the light-shielding bank is disposed between adjacent pixel units.

\* \* \* \* \*